United States Patent
Choo et al.

(10) Patent No.: US 8,228,704 B2
(45) Date of Patent: Jul. 24, 2012

(54) STACKED SEMICONDUCTOR CHIP PACKAGE WITH SHARED DLL SIGNAL AND METHOD FOR FABRICATING STACKED SEMICONDUCTOR CHIP PACKAGE WITH SHARED DLL SIGNAL

(75) Inventors: Chul-Hwan Choo, Paju-si (KR); Hi-Choon Lee, Yongin-si (KR); Young-Yong Byun, Seoul (KR)

(73) Assignee: Samsung Electronics Co., Ltd. (KR)

( * ) Notice: Subject to any disclaimer, the term of this patent is extended or adjusted under 35 U.S.C. 154(b) by 1185 days.

(21) Appl. No.: 12/072,401

(22) Filed: Feb. 26, 2008

(65) Prior Publication Data

US 2008/0204091 A1     Aug. 28, 2008

(30) Foreign Application Priority Data

Feb. 28, 2007  (KR) .................. 10-2007-0020105
May 10, 2007  (KR) .................. 10-2007-0045280

(51) Int. Cl.
*G11C 5/06* (2006.01)
(52) U.S. Cl. ............. 365/63; 365/51; 257/676; 257/777
(58) Field of Classification Search ............... 365/51 X, 365/63 O, 191, 194, 51, 63; 257/676 X, 257/777 X, 676, 777
See application file for complete search history.

(56) References Cited

U.S. PATENT DOCUMENTS

| | | | |
|---|---|---|---|
| 5,760,478 A | 6/1998 | Bozso et al. | |
| 6,078,514 A | 6/2000 | Takemae et al. | |
| 6,493,394 B2 * | 12/2002 | Tamura et al. | 375/257 |
| 6,927,488 B2 | 8/2005 | Yoo et al. | |
| 7,123,497 B2 | 10/2006 | Matsui et al. | |
| 7,327,590 B2 * | 2/2008 | Matsui et al. | 365/51 |
| 7,466,577 B2 * | 12/2008 | Sekiguchi et al. | 365/51 |
| 7,623,398 B2 * | 11/2009 | Arai | 365/194 |
| 2004/0257847 A1 | 12/2004 | Matsui et al. | |
| 2005/0073033 A1 | 4/2005 | Yoo et al. | |
| 2006/0262587 A1 | 11/2006 | Matsui et al. | |

FOREIGN PATENT DOCUMENTS

| | | |
|---|---|---|
| JP | 2006-065916 A | 3/2006 |
| KR | 2003-0071027 | 9/2003 |
| KR | 10-2004-0091580 | 10/2004 |

* cited by examiner

*Primary Examiner* — VanThu Nguyen
(74) *Attorney, Agent, or Firm* — Onello & Mello, LLP

(57) ABSTRACT

A semiconductor chip package and a semiconductor chip fabricating method are provided. A semiconductor chip package comprises at least two semiconductor chips having a stacked configuration, the semiconductor chips at least one of: sharing DC signals of DC generating circuits provided by one of the semiconductor chips; and sharing a DLL clock signal of a DLL circuit provided by the semiconductor chip having the DC generating circuits or provided by another semiconductor chip. Power consumption can be reduced, and sharing a DLL clock is valid. In addition, a stabilized DC supply can be guaranteed and an increase for level trimming range and productivity can be improved.

6 Claims, 10 Drawing Sheets

STACKED SEMICONDUCTOR CHIP PACKAGE WITH SHARED DLL SIGNAL AND METHOD FOR FABRICATING STACKED SEMICONDUCTOR CHIP PACKAGE WITH SHARED DLL SIGNAL

This U.S. nonprovisional patent application claims priority under 35 U.S.C. §119 to Korean Patent Applications 10-2007-0020105 filed on Feb. 28, 2007, and 10-2007-0045280 filed on May 10, 2007, the entire content of being hereby incorporated by reference.

FIELD OF THE INVENTION

Embodiments of the present invention relate to semiconductor devices. More particularly, embodiments of the present invention relate to a semiconductor chip package and a semiconductor chip fabricating method, capable of sharing a DLL clock signal or DC signals in a multi-chip package (MCP) having a dual-die package(DDP).

DESCRIPTION OF THE RELATED ART

The development of semiconductor technology has brought about an exponential growth of function and capacity available in a single-chip format as relatively more devices can be integrated within the same chip area. With such advancement in function and capacity, technology corresponding to miniaturization and reduction in weight of products further requires continuous development of packaging technologies. As one of such packaging technologies, a technology such as a multi-chip package, multi-stack package etc., for which plural semiconductor chips are built in one semiconductor package, have enjoyed widespread use.

In a multichip packaging technology, a plurality of semiconductor chips are mounted in a common, single, lead frame so as to form one package. As mentioned above, the multichip packaging technology is primarily applied to an application field such as portable devices etc. that necessarily requires miniaturization and reduced weight. This technology is widely used in cases, for example, where a plurality of memory chips are stacked to obtain a memory of high capacity, or where various kinds of memory chips and controllers necessary for a device are integrated within the same package, etc.

As one of available multichip package technologies, a dual die package(DDP) incorporates two chips into one package. Two chips may be laid side by side, in parallel, in the dual die package, or two chips may be stacked to substantially reduce the area occupied by the package.

Semiconductor memory devices are commonly fabricated to include memory cells, a core circuit, and peripheral circuits, within a single chip. Peripheral circuits can generally include a delay lock loop (DLL) circuit and DC generating circuits. DC generating circuits provided in the peripheral circuit area operate to supply DC-level power, and are necessary for basic operation of the semiconductor memory device.

DC generating circuits can include a VCCH generating circuit as an initialization circuit, a reference voltage generating circuit to generate a reference voltage, an array voltage and peripheral voltage generating circuit to generate array and peripheral voltages, a VPP generating circuit to boost a word line, a VBB generating circuit for applying a bias to memory cells, and the like. Such DC generating circuits may include pumping capacitors or a plurality of fuses to obtain a required output level.

The DC generating circuits require large resistors as a result of its characteristics, and require large transistors based, both of which can occupy a large area of available space, and therefore limit the area of the semiconductor memory device. The DC generating circuits are required for every semiconductor memory device, and so in forming one package structure by using numerous chips, despite that DC power can be supplied to numerous chips using a DC generating circuit present on one chip, all DC generating circuits present on the respective chips are individually driven, thus power consumption is high.

A delay lock loop (hereinafter, referred to as 'DLL') is a circuit that is used to make an internal clock of a synchronous memory equal to an external clock without error, the internal clock of the synchronous memory using a clock in a semiconductor memory device. That is, when an externally applied clock is used internally, a delay time is produced, and thus, the DLL is used to make an internal clock synchronous with the external clock by controlling the delay time. In employing the DLL circuit in a semiconductor chip, the DLL circuit has been generally employed by every unit of a semiconductor chip.

A case where a plurality of semiconductor chips, each having the DLL circuit, are constituted in one package, for example, a dual die package, is described as follows. The dual die package is a type of high-density package, and incorporates two chips into a single package. Two chips of the same structure form one package, and have the same interface, yet each includes each DLL circuit. The two chips use the same external clock and perform the same operation. Despite this, the two DLL circuits of the two chips operate separately, leading to increased power consumption.

SUMMARY OF THE INVENTION

Some embodiments of the invention provide a semiconductor chip package and a semiconductor chip fabricating method, which are capable of reducing the horizontal area occupied by a main chip, by adapting a specific DC chip that provides a stabilized DC voltage or current. In addition, a DLL circuit may also be adapted as a specific chip. Production costs can be reduced and power consumption decreased. A plurality of semiconductor chips can therefore be made to share a DLL clock signal, reducing the resulting chip size.

According to some embodiments of the invention, a semiconductor chip package comprises at least two semiconductor chips having a stacked configuration, the semiconductor chips at least one of: sharing DC signals of DC generating circuits provided by one of the semiconductor chips; and sharing a DLL clock signal of a DLL circuit provided by the semiconductor chip having the DC generating circuits or provided by another semiconductor chip.

Any one of the semiconductor chips may be a DC chip including the DC generating circuits, and a semiconductor chip providing the DLL clock signal and other semiconductor chips may be coupled to one another through a DLL path.

According to some embodiments of the invention, a semiconductor chip package comprises: a DC chip and at least one main chip in a stacked configuration; the DC chip including only DC generating circuits for generating DC signals required for operation of the main chip; and the main chip including at least one circuit responding to the DC signals generated from at least one of the DC generating circuits, the DC generating circuits being located exclusively on the DC chip and not on the main chip.

The DC generating circuits may comprise at least one of a VCCH generating circuit for system initialization, a reference voltage generating circuit to generate a reference voltage, an array voltage and peripheral voltage generating circuit to generate an array voltage and a peripheral voltage, a VPP generating circuit to boost a word line voltage, and a VBB generating circuit biasing a memory cell. The DC chip can comprise a single chip and the main chip can comprise a plurality of main chips to thereby comprise a multichip package structure. The DC chip and the main chip may be coupled by at least one via. The DC chip may further comprise a DLL circuit. Unlike it, the semiconductor chip package may further comprise a DLL chip having a DLL circuit. The plurality of main chips having the multichip package structure may share a DLL clock signal of a DLL circuit provided on one of the main chips.

According to some embodiments of the invention, a semiconductor chip set comprises a DC chip including exclusively DC generating circuits for generating DC voltage signals required for operation; and at least one main chip including at least one circuit responding to a DC signal generated from at least one of the DC generating circuits.

The DC generating circuits may comprise at least one of a VCCH generating circuit as an initialization circuit, a reference voltage generating circuit to generate a reference voltage, an array voltage and peripheral voltage generating circuit to generate an array voltage and a peripheral voltage, a VPP generating circuit to boost a word line voltage, and a VBB generating circuit for biasing a memory cell.

The DC chip may further comprise a DLL circuit, and the chip package may further comprise a DLL chip having a DLL circuit. The main chip can comprise a plurality of main chips, and the plurality of main chips share a DLL clock signal of a DLL circuit provided on one of the main chips.

According to some embodiments of the invention, a method of fabricating a semiconductor chip comprises separately fabricating a DC chip and at least one main chip, and coupling the chips to each other through a specific process, the DC chip including only DC generating circuits to generate DC power required for operation of the semiconductor chip, and the at least one main chip including, except the DC generating circuits, at least one circuit responding to a DC signal generated from at least one of the DC generating circuits.

The DC generating circuits may comprise at least one of a VCCH generating circuit as an initialization circuit, a reference voltage generating circuit to generate a reference voltage, an array voltage and peripheral voltage generating circuit to generate an array voltage and peripheral voltage, a VPP generating circuit to boost a word line, and a VBB generating circuit for a bias of memory cell. The DC chip and the main chip may be fabricated as one semiconductor chip package type in a stack structure.

The DC chip may be adapted one, and the main chip may be adapted a plural number, through a multichip package structure. The DC chip and the main chip may be coupled through at least one via.

According to some embodiments of the invention, a semiconductor chip comprises only at least one DC generating circuit among a VCCH generating circuit as an initialization circuit, a reference voltage generating circuit to generate a reference voltage, an array voltage and peripheral voltage generating circuit to generate an array voltage and a peripheral voltage, a VPP generating circuit to boost a word line voltage, and a VBB generating circuit for biasing a memory cell.

The semiconductor chip may comprise a DLL circuit.

According to some embodiments of the invention, a semiconductor chip package comprises at least two semiconductor chips having a stacked configuration, the semiconductor chips including at least one DLL path to share a DLL clock signal generated by any one of the semiconductor chips.

Each of the semiconductor chips includes a DLL circuit and a switching circuit for enabling or disabling the DLL circuit. Only one DLL circuit provided on any one of the semiconductor chips is in an enable state, and a remainder of the DLL circuits on other semiconductor chips is in a disable state.

The DLL circuit provided in each of the semiconductor chips may comprise a main delay chain unit including a plurality of main delay sells, for delaying an external clock signal, and outputting a first clock signal; an interpolation unit for outputting a second clock signal obtained by interpolating the first clock signal; a switching unit for performing a switching of the DLL path and a switching for an enable or disable of the DLL circuit, and outputting the second clock signal or the DLL clock signal in response; a delay selection unit for selecting a delay compensation of the second clock signal or the DLL clock signal output from the switching unit, and generating a third clock signal; a replica path unit configured to have a same delay condition as an actual clock path, the replica path unit receiving the third clock signal, delaying it by a given time according to a delay condition, and outputting a fourth clock signal; and a phase detecting unit for comparing phases of the fourth clock signal and the external clock signal, outputting a detection signal corresponding to the comparison result, and controlling a delay amount of the first clock signal output from the main delay chain unit.

The switching unit may cut off the second clock signal when the DLL clock signal is input through the DLL path, and transmit the DLL clock signal to the delay selection unit. When the DLL clock signal is not input through the DLL path, the switching unit may transmit the second clock signal to the DLL path and the delay selection unit. The delay selection unit may output the DLL clock signal as the third clock signal without a delay when the DLL clock signal is input, and may compensate the second clock signal for a delay amount corresponding to the DLL path when the second clock signal is input, and may output it as a third clock signal. The delay selection unit may comprise a compensation delay chain including a plurality of compensation delay cells selectable for a delay amount through a fuse option; and a multiplexer for selecting and outputting any one clock signal among a clock signal directly input without passing through the compensation delay chain and a clock signal compensated for a delay through the compensation delay chain.

The semiconductor chip package may have a stacked configuration of one master chip and at least one slave chip. The master chip may have a structure of providing the DLL clock signal to the at least one slave chip through the DLL path in the DLL circuit.

The switching unit of the DLL circuit adapted in the master chip may transmit the DLL clock signal as the second clock signal to the at least one slave chip through the DLL path, and transmit the second clock signal to the delay selection unit. The delay selection unit of the DLL circuit adapted in the master chip may compensate for a delay of the second clock signal, and output it as a third clock signal.

The switching unit of the DLL circuit adapted in the at least one slave chip may transmit the DLL clock signal transmitted through the DLL path, to the delay selection unit, and cut off a second clock signal output from an interpolation unit. The delay selection unit of the DLL circuit adapted in the at least one slave chip may output the DLL clock signal as the third clock signal without a delay compensation.

The DLL path may be formed by a 'through VIA connection' technique to connect between semiconductor chips through at least one via, and the semiconductor chips may have the same structure and kind.

According to some embodiments of the invention, a DLL circuit adapted within a semiconductor chip comprises a main delay chain unit including a plurality of main delay cells, for delaying an external clock signal input from the outside, and outputting a first clock signal; an interpolation unit for outputting a second clock signal obtained by interpolating the first clock signal; a DLL path for a sharing of DLL clock signal with other semiconductor chip; a switching unit for performing a switching of the DLL path and a switching for an enable or disable of the DLL circuit, and outputting the second clock signal or the DLL clock signal; a delay selection unit for selecting a delay compensation of the second clock signal or the DLL clock signal output from the switching unit, and generating a third clock signal; a replica path unit configured to have the same delay condition as an actual clock path, the replica path unit being for receiving the third clock signal, delaying it by a given time according to a delay condition, and outputting a fourth clock signal; and a phase detecting unit for comparing phases of the fourth clock signal and the external clock signal, outputting a detection signal corresponding to the comparison result, and controlling a delay amount of the first clock signal output from the main delay chain unit.

The switching unit may cut off the second clock signal when the DLL clock signal is input through the DLL path, and transmit the DLL clock signal to the delay selection unit, and may transmit the second clock signal to the DLL path and the delay selection unit when the DLL clock signal is not input through the DLL path. The delay selection unit may output the DLL clock signal as the third clock signal without a delay when the DLL clock signal is input, and may compensate the second clock signal for a delay amount corresponding to the DLL path when the second clock signal is input, and may output it as a third clock signal.

The delay selection unit may comprise a compensation delay chain including a plurality of compensation delay cells selectable for a delay amount through a fuse option; and a multiplexer for selecting a clock signal output from the switching unit without a delay or a clock signal compensated for a delay through the compensation delay chain.

According to some embodiments of the invention, a method of sharing a DLL clock signal between a plurality of semiconductor chips constituting a package comprises dividing the plurality of semiconductor chips into one master chip and at least one slave chip, and forming a DLL path for providing the DLL clock signal from the master chip to the at least one slave chip; generating a DLL clock signal in a DLL circuit adapted within the master chip, and transmitting the DLL clock signal to the at least one slave chip through the DLL path; and compensating for a delay of the DLL clock signal within the master chip so as to use it as a clock signal, and using a DLL clock signal transmitted through the DLL path, as a clock signal without a delay compensation, within the at least one slave chip.

The compensation of the DLL clock signal within the master chip may be performed corresponding to a delay amount of the DLL path, and the semiconductor chips may each have a DLL circuit. When the DLL clock signal is transmitted through the DLL path, a DLL circuit within the at least one slave chip may be disabled, and when the DLL clock signal is not transmitted through the DLL interior, a DLL circuit within the at least one slave chip may be enabled.

In the configuration described above, power consumption can be reduced, and a valid DLL clock can be shared. In addition, a stable DC supply can be ensured, an increase in level trimming range can be attained, and fabrication productivity can be improved.

BRIEF DESCRIPTION OF THE DRAWINGS

The foregoing and other features and advantages of the invention will be apparent from the more particular description of embodiments of the invention, as illustrated in the accompanying drawings in which like reference characters refer to the same parts throughout the different views, in which.

DETAILED DESCRIPTION OF EMBODIMENTS OF THE INVENTION

Embodiments of the present invention now will be described more fully hereinafter with reference to the accompanied drawings. This invention may, however, be embodied in many different forms and should not be construed as limited to the embodiments set forth herein. Rather these embodiments are provided so that this disclosure will be thorough and complete, and will fully convey the scope of the invention to those skilled in the art.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein. Exemplary embodiments of the present invention are more fully described below with reference to the accompanied drawings. This invention may, however, be embodied in many different forms and should not be construed as being limited to the exemplary embodiments set forth herein; rather, these exemplary embodiments are provided so that this disclosure is thorough and complete, and conveys the concept of the invention to those skilled in the art.

Figure 1:
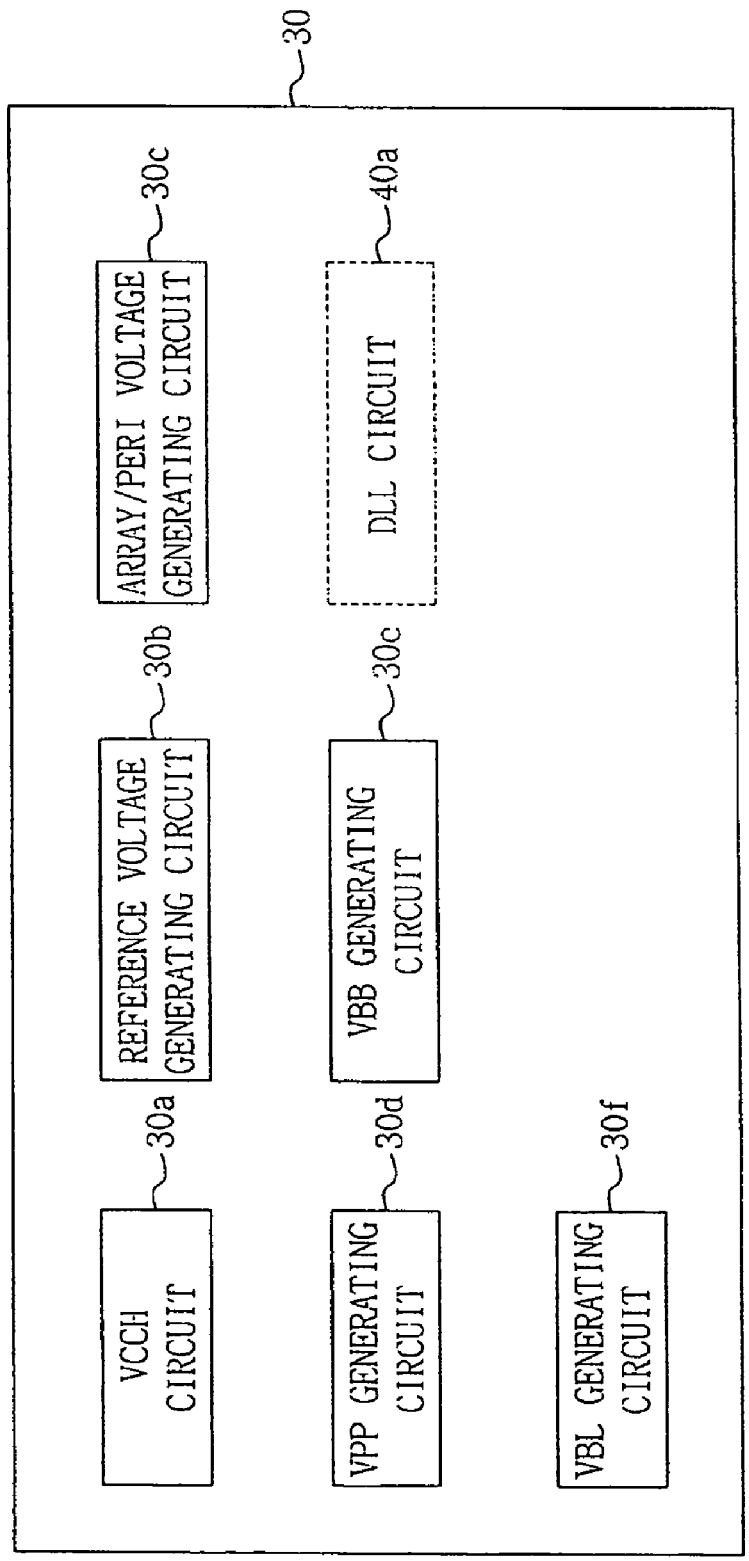
FIG. 1 is a block diagram of a DC chip according to an embodiment of the invention.

FIG. 1 is a block diagram of DC chip according to an embodiment of the invention.

Referring to FIG. 1, a DC chip 30 according to an embodiment of the invention can comprise DC voltage generating circuits, that is, at least one of DC voltage generating circuits such as a VCCH generating circuit 30a used for voltage generation during initialization, a reference voltage generating circuit 30b to generate a reference voltage used for a sense amplifier etc., an array voltage and peripheral voltage generating circuit 30c, a word line boost voltage (VPP) generating circuit 30d, and a back bias voltage (VBB) generating circuit 30e. The DC chip 30 may further comprise a bit line precharge voltage (VBL) generating circuit 30f for precharging bit lines BL. Other DC generating circuits can be provided in the DC chip 30 including all DC-generating-related circuits used for generating a DC power, in addition to the DC generating circuits described above.

Other than these DC generating circuits, additional system circuits need not be included in the DC chip 30. However, a DLL(Delay Lock Loop) circuit 40a or PLL(Phase Lock Loop) circuit may optionally be included in the DC chip 30. When the DLL circuit 40a or PLL circuit is fabricated as another specific chip on a different chip die, the DLL circuit 40a or PLL circuit does not need to be included in the DC chip 30.

A DLL circuit or PLL circuit is generally applied to make an internal clock of a semiconductor memory device equal in delay or phase to an externally applied clock, without error. In other words, the DLL circuit or PLL is used to synchronize an internal clock with an externally applied clock by controlling this delay time or phase. The configuration and operation of the DLL circuit are described below.

The DC generating circuits are necessarily or selectively adapted in a general semiconductor memory device, and the configuration and operation thereof are well known to those skilled in the art; thus a detailed description for each of them is omitted.

The DC generating circuits have a characteristic of having a relatively small influence from external factors such as PVT (Power, Voltage, Temperature) and of guaranteeing a constant output. The DC generating circuits include plural fuses that are used for voltage trimming to ensure a required output voltage level, and may include plural pumping capacitors in cases where a voltage boost is required.

The DC generating circuits include relatively large resistors and transistors of a relatively large size; thus it is desired to produce the DC chips 30 at a comparatively low cost since those fine processes required for certain types of densely arranged devices, such as memory cell or other circuits, is not needed. Further, the circuits are operable independently, and are comparatively free from limitations of consumed area; thus it is possible to achieve a more precise target voltage level by increasing the voltage trimming range by employing more fuses or pumping capacitors.

In a specific configuration of the DC chip 30, the DC generating circuit is not provided in other semiconductor chips of the package, such as a memory cell chip (hereinafter, referred to 'main chip' in order for a distinction from the DC chip) that includes at least one or more circuits that respond to a DC signal generated by the DC generating circuits. Therefore, by using such a main chip separately from the DC chip, the area occupied by the existing DC generating circuit can be reduced. Also, since the main chip substrate is separate from the DC chip substrate, the main chip substrate is isolated from noise etc. that may be caused by DC chip operations, such as DC pumping, and the like, leading to a more stabilized operation.

FIGS. 2 to 5 provide embodiments of a semiconductor chip package using the configuration of FIG. 1.

Figure 2:
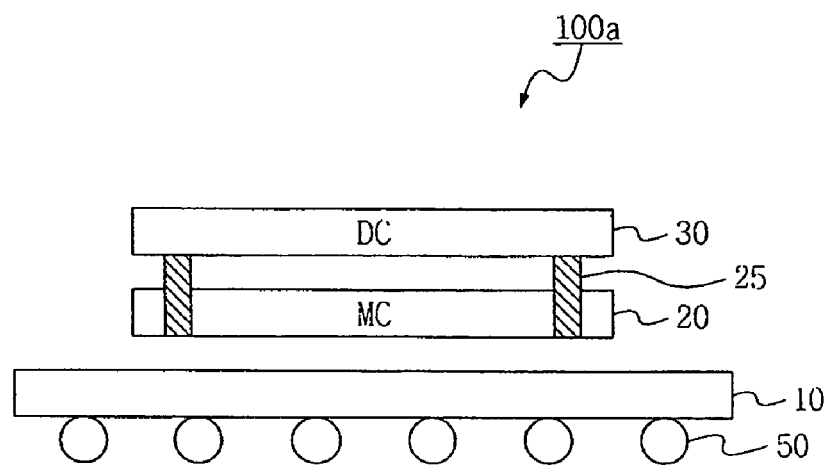
FIGS. 2 to 5 illustrate a structure of a semiconductor chip package according to some embodiments of the invention.

FIG. 2 illustrates a structure of semiconductor chip package according to an embodiment of the invention through the use of two separate chips, rather than a package obtained by using a single chip as in the conventional art.

As shown in FIG. 2, a semiconductor chip package 110a according to an embodiment of the invention has a stacked structure of two chips 20 and 30, for example formed on different wafers.

That is, a main chip 20 is disposed over a substrate 10, and DC chip 30 is disposed over the main chip 20. Solder balls 50 may be adhered to the substrate 10 for packaging purposes.

The DC chip 30 can, for example, be configured as described above in connection with FIG. 1.

The main chip 20 can take the form of any of a number of semiconductor chips having at least one of that circuits that operate in response to DC signals generated by the DC generating circuits that are provided by the DC chip 30. In this manner, the DC generating circuits that support the operation of the main chip 20 are not provided on the main chip 20, but rather are provided on the separate, DC chip 30.

The DC chip 30 and the main chip 20 can, for example, be connected through a number of vias 25. For example, in one interconnection configuration, ports of one chip can have a convex protrusion, and ports of another chip can have corresponding recesses at the same positions. Two chips are connected to each other using only a stacked chip structure, and without a specific wiring connection. This is known in the industry as a 'through VIA connection' technique.

Layout positions of the main chip 20 and the DC chip 30 can be mutually changed, and may be varied in accordance with design practices.

Figure 3:
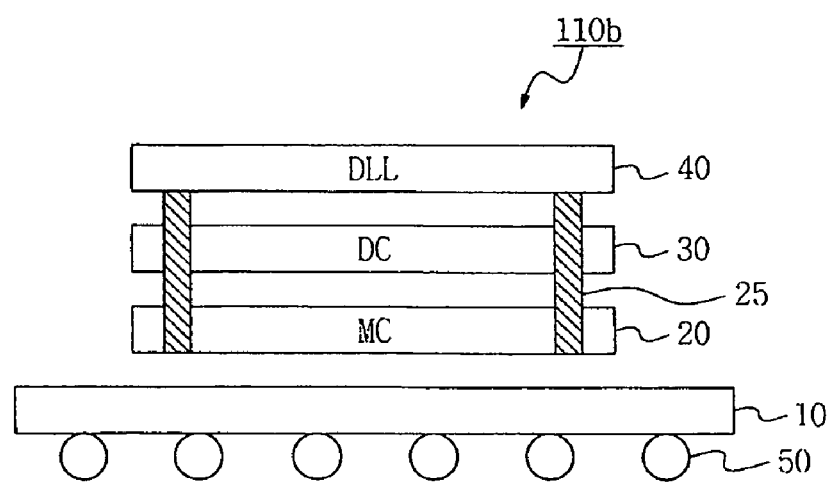

FIG. 3 illustrates a semiconductor chip package structure employing a specific DLL chip 40 having a DLL circuit in addition to the configuration of FIG. 2, according to another embodiment of the invention.

As shown in FIG. 3, a semiconductor chip package 110b according to another embodiment of the invention has a stacked structure of three chips 20, 30 and 40, for example formed on different wafers. Main chip 20 is disposed over a substrate 10, DC chip 30 is disposed over the main chip 20, and DLL chip 40 is disposed over the DC chip 30.

The DC chip 30 can be configured as described above in connection with the embodiment of FIG. 1.

The main chip 20 can take the form of any of a number of semiconductor chips having at least one of that circuits that operate in response to DC signals generated by the DC generating circuits that are provided by the DC chip 30 and in response to DLL signals generated by the DLL circuits operating on the DLL chip 40. In this manner, the DC generating circuits that support the operation of the main chip 20 and the DLL circuits that support the operation of the main chip 20 are not provided on the main chip 20, but rather are provided on the separate, DC chip 30 and DLL chip 40.

The DC chip 30, the main chip 20 and the DLL chip 40 may be connected through vias 25, which, optionally, can be configured as described above in connection with FIG. 2.

Layout positions of the main chip 20, the DC chip 30 and the DLL chip can be mutually changed, and may be varied in accordance with design practices. For example, the DLL chip 40 may be disposed below the DC chip 30, and the DC chip 30 or the DLL chip 40 may be disposed below the main chip 20.

Figure 4:
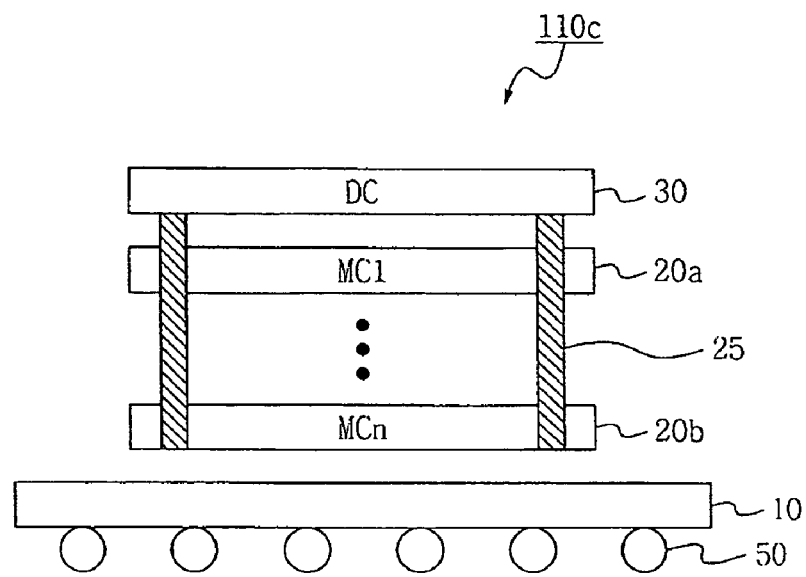

FIG. 4 illustrates a structure of a semiconductor chip package in a multichip package (MCP) structure with a plurality of main chips according to another embodiment of the invention.

As shown in FIG. 4, a semiconductor chip package 110c according to another embodiment of the invention is provided with a plurality of main chips 20a and 20b according to the configuration of FIG. 2. This configuration has the advantage of the ability to drive a plurality of main chips 20a and 20b by using a single DC chip 30.

The main chip may be formed of the n-number MC1~MCn of main chips in a stacked structure, wherein n is a natural number of 1 or more. The n number of main chips 20*a* and 20*b* may be the same kind, or different kinds, of semiconductor chips. For example, all main chips 20*a* and 20*b* may be DRAM chips not including DC generating circuits, or a portion may be DRAM chips and a portion may be SRAM chips. The main chips 20*a* and 20*b* may be at least one or more semiconductor chips selected from semiconductor chips apparent to those skilled in the art.

The plurality of main chips 20*a* and 20*b* are stacked on the substrate 10, and the DC chip 30 is disposed above the main chips 20*a* and 20*b*. Layout positions of the main chips 20*a* and 20*b* and the DC chip 30 can be mutually changed, and may be varied in accordance with design practices. For example, the DC chip 30 can be disposed between or below the main chips 20*a* and 20*b*.

The DC chip 30 can be configured as described above in connection with the embodiment of FIG. 1.

The main chips 20*a*, 20*b* can take the form of any of a number of semiconductor chips having at least one of that circuits that operate in response to DC signals generated by the DC generating circuits that are provided by the DC chip 30. In this manner, the DC generating circuits that support the operation of the main chips 20*a*, 20*b* are not provided on the main chip 20*a*, 20*b*, but rather are provided on the separate, DC chip 30.

The plurality of main chips 20*a* and 20*b* having the multi-chip package structure may further be configured to share a DLL clock signal of DLL circuit provided in any one main chip of the main chips 20*a* and 20*b*. The main chips 20*a* and 20*b* can further optionally each include a DLL circuit, and are connected to each other through a DLL path so as to share a DLL clock signal of the DLL circuit adapted in the at least one of the main chips.

The DC chip 30 and the main chip 20 can, for example, be connected through a number of vias 25, as described above, in connection with FIG. 2. Layout positions of the main chips 20*a*, 20*b* and the DC chip 30 can be mutually changed, and may be varied in accordance with design practices.

Figure 5:
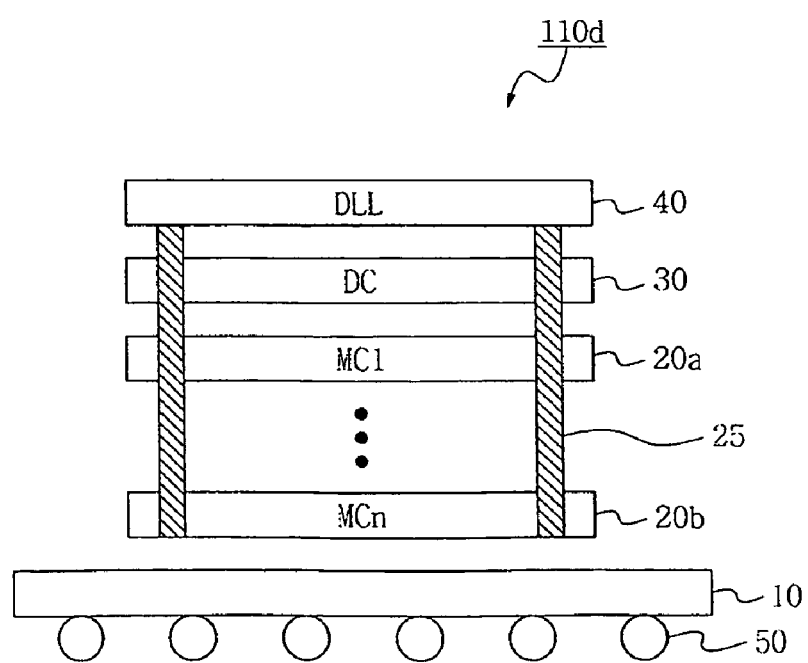

FIG. 5 illustrates a stacked structure with a specific DLL chip 40 added to the structure of FIG. 4 according to another embodiment of the invention.

As shown in FIG. 5, a semiconductor chip package 110*d* according to another embodiment of the invention has the stacked structure of FIG. 4, further including a DLL chip 40 in the stack. This configuration has the advantage of driving a plurality of main chips 20*a* and 20*b* by using one DC chip 30 and one DLL chip 40.

The main chips 20*a*, 20*b* can take the form of any of a number of semiconductor chips having at least one of that circuits that operate in response to DC signals generated by the DC generating circuits that are provided by the DC chip 30 and in response to DLL signals generated by the DLL circuits operating on the DLL chip 40. In this manner, the DC generating circuits that support the operation of the main chips 20*a*, 20*b* and the DLL circuits that support the operation of the main chips 20*a*, 20*b* are not provided on the main chips 20*a*, 20*b*, but rather are provided on the separate, DC chip 30 and DLL chip 40.

The DC chip 30, the main chips 20*a*, 20*b* and the DLL chip 40 may be connected through vias 25, which, optionally, can be configured as described above in connection with FIG. 2.

Layout positions of the main chips 20*a*, 20*b*, the DC chip 30 and the DLL chip can be mutually changed, and may be varied in accordance with design practices. For example, the DLL chip 40 may be disposed below the DC chip 30, and the DC chip 30 or the DLL chip 40 may be disposed below or between the main chips 20*a*, 20*b*.

Figure 6:
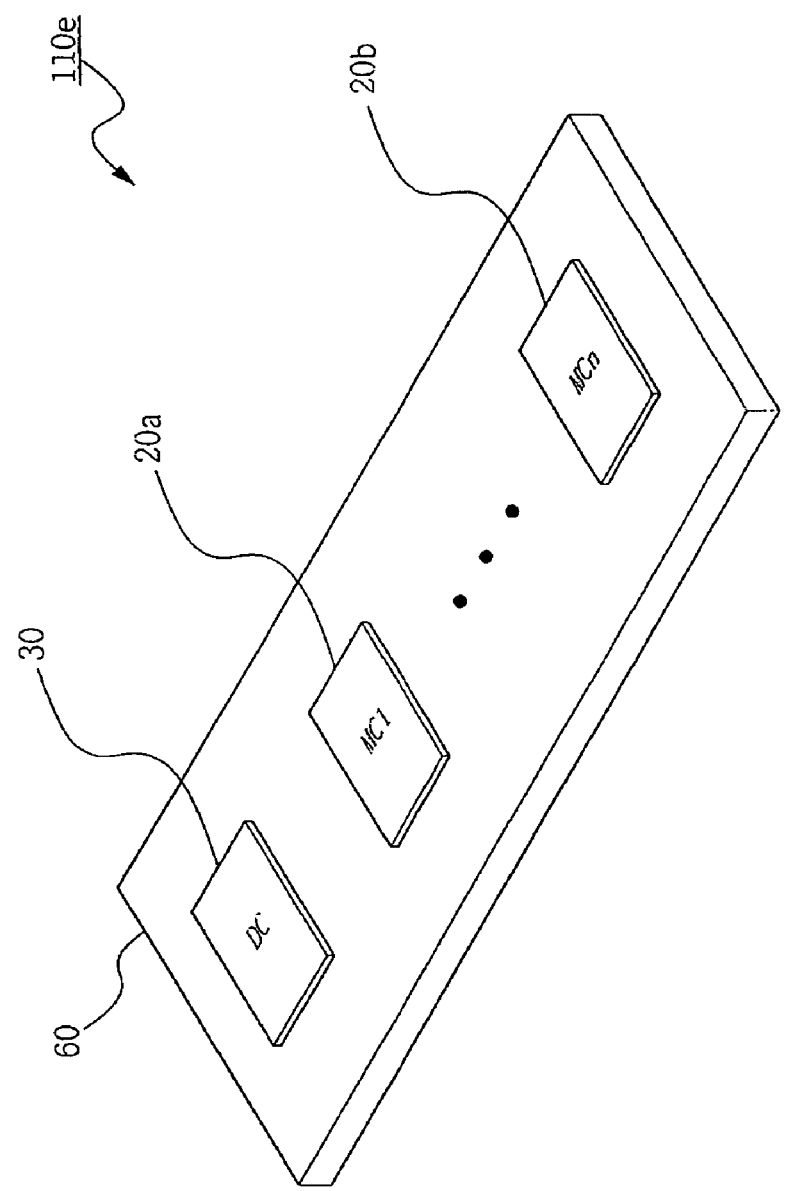
FIGS. 6 and 7 illustrate a structure of a semiconductor chip set according to some embodiments of the invention.
Figure 7:
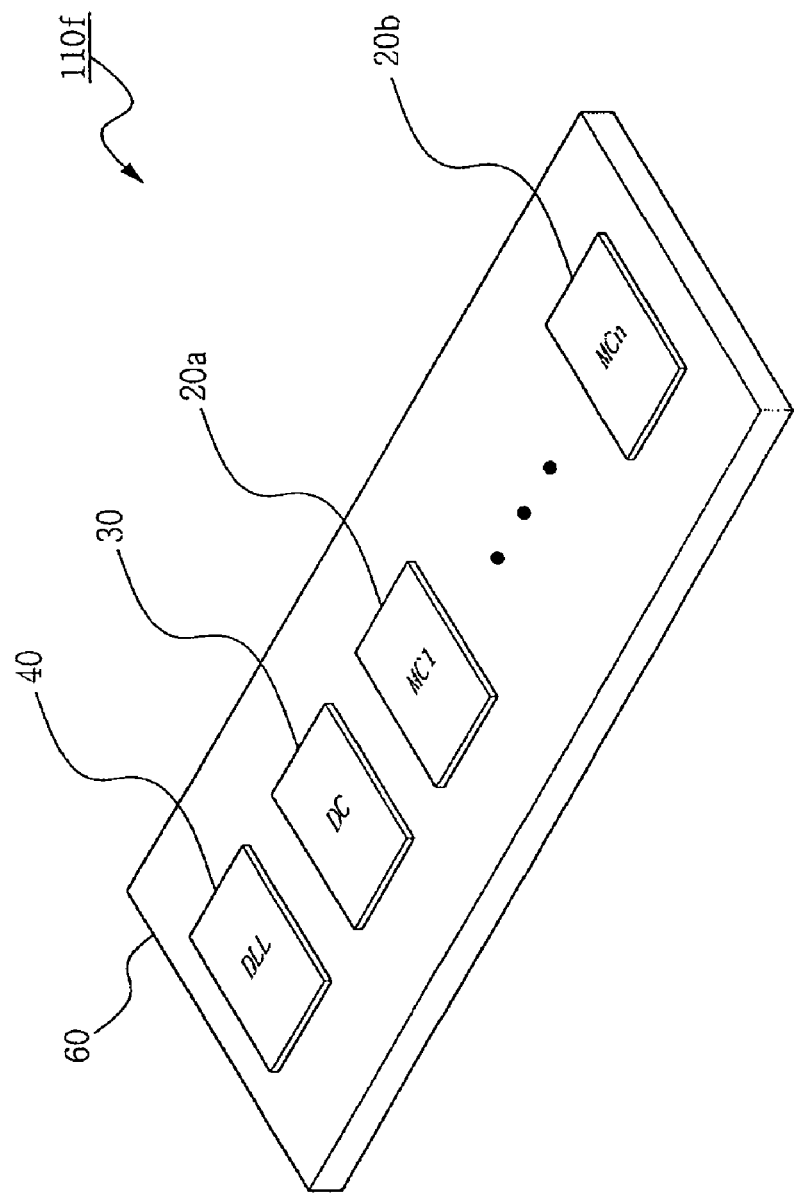

FIGS. 6 and 7 illustrate a semiconductor chip set structure according to embodiments of the invention.

FIG. 6 illustrates a semiconductor chip set structure 1110*e* according to another embodiment of the invention, and there are shown one DC chip 30 and a plurality of main chips 20*a* and 20*b*.

As shown in FIG. 6, a semiconductor chip set 110*e* according to another embodiment of the invention has a structure that one DC chip 30 and a plurality of main chips 20*a* and 20*b* are disposed on different chip layout areas of a substrate 60.

The main chips 20*a*, 20*b* may be formed of the n-number MC1~MCn of main chips, wherein n is a natural number of 1 or more. The n number of main chips 20*a* and 20*b* may be the same kind, or different kinds, of semiconductor chips. For example, all main chips 20*a* and 20*b* may be DRAM chips not including DC generating circuits, or a portion may be DRAM chips and a portion may be SRAM chips. The main chips 20*a* and 20*b* may be at least one or more semiconductor chips selected from semiconductor chips apparent to those skilled in the art.

Layout positions of the main chips 20*a* and 20*b* and the DC chip 30 can be mutually changed, and may be varied in accordance with design practices. For example, the DC chip 30 can be disposed between the main chips 20*a* and 20*b*.

The DC chip 30 can be configured as described above in connection with the embodiment of FIG. 1.

The main chips 20*a*, 20*b* can take the form of any of a number of semiconductor chips having at least one of that circuits that operate in response to DC signals generated by the DC generating circuits that are provided by the DC chip 30. In this manner, the DC generating circuits that support the operation of the main chips 20*a*, 20*b* are not provided on the main chip 20*a*, 20*b*, but rather are provided on the separate, DC chip 30.

The DC chip 30 and the main chips 20*a*, 20*b* can, for example, be connected through a number of interconnect routing wires that are routed through the substrate 60 to which they are bonded or mounted.

FIG. 7 illustrates a semiconductor chip set structure 110*f* according to another embodiment of the invention. As shown in FIG. 7, a semiconductor chip package 110*f* according to another embodiment of the invention has the layout structure of FIG. 6, and further including a DLL chip 40 in the layout. This configuration has the advantage of driving a plurality of main chips 20*a* and 20*b* by using one DC chip 30 and one DLL chip 40.

The main chips 20*a*, 20*b* can take the form of any of a number of semiconductor chips having at least one of the circuits that operate in response to DC signals generated by the DC generating circuits that are provided by the DC chip 30 and in response to DLL signals generated by the DLL circuits operating on the DLL chip 40. In this manner, the DC generating circuits that support the operation of the main chips 20*a*, 20*b* and the DLL circuits that support the operation of the main chips 20*a*, 20*b* are not provided on the main chips 20*a*, 20*b*, but rather are provided on the separate, DC chip 30 and DLL chip 40.

Layout positions of the main chips 20*a*, 20*b*, the DC chip 30 and the DLL chip can be mutually changed, and may be varied in accordance with design practices. For example, the DC chip 30 or the DLL chip 40 may be disposed between the main chips 20*a*, 20*b*.

The DC chip 30, the DLL chip 40, and the main chips 20*a*, 20*b* can, for example, be connected through a number of interconnect routing wires that are routed through the substrate 60 to which they are bonded or mounted.

According to embodiments of the invention described above, DC generating circuits and/or DLL circuits which otherwise would occupy a large area of a peripheral area can be configured on a separate, independent chip, or configured to share a DLL clock signal. Thus, the horizontal area occupied by a main chip can be reduced, and a stabilized DC supply can be provided. In addition, a voltage level trimming range increase and an increase in production efficiency can be obtained.

Certain configurations in which a DLL clock signal is shared among main chips is described in detail, as follows. A general DLL circuit of a semiconductor chip will initially be described, and then a DLL circuit in connection with an embodiment of the invention and a semiconductor chip having the same are described as follows.

Figure 8:
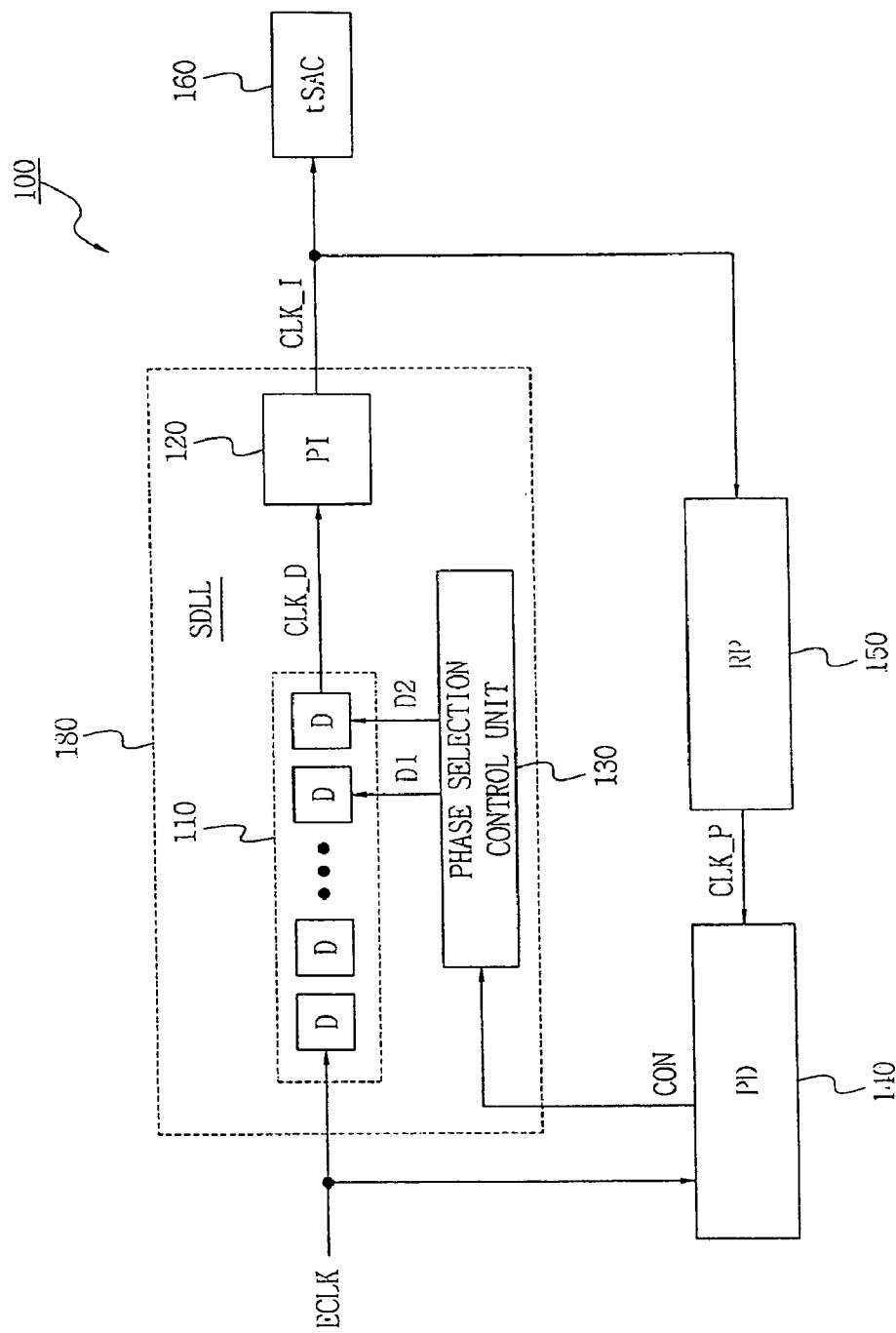
FIG. 8 is a block diagram of a general DLL circuit.

FIG. 8 is a block diagram illustrating an example of general DLL circuit.

As shown in FIG. 8, a general DLL circuit 100 includes a delay chain unit 110, a phase interpolation (PI) unit 120, a phase selection control unit 130, a phase detecting unit 140, and a replica path unit 150.

The delay chain unit 110 is constructed of a plurality of delay cells, and outputs a clock signal CLK_D that is obtained by delaying, by a given time, an external clock signal ECLK as a reference clock input from an external device. The delay amount applied by the delay chain unit 110 is controlled by the phase selection control unit 130. The delay amount is determined in response to a phase difference between the external clock signal ECLK and a feedback clock signal CLK_P through the replica path unit 150. For example, the phase selection control unit 130 selects two clock signals CLK_D having a smallest phase difference from the external clock signal ECLK among clock signals passed through the delay cells D by using control signals D1, D2.

The interpolation unit 120 adequately controls two clock signals CLK_D having different phases output by the delay chain unit 110, and generates an optional clock signal CLK_I between two clock signals. An interpolator as a circuit used for an interpolation is used for various application circuits, with the advantage of precisely outputting a desired phase. The interpolation unit 120 interpolates clock signal CLK_D output from the delay chain unit 110, and generates clock signal CLK_I having a proper phase.

The replica path unit 150 includes a circuit that is configured to have the same delay condition as an actual clock path (called 'tSAC path') through which clock signal CLK_I output from the interpolation unit 120 is transferred to a final data output terminal of the semiconductor memory device. The circuit is referred to as a replica circuit or replica path. In the replica path unit 150, clock signal CLK_I output from the interpolation unit 120 is reproduced in the same delay condition as the actual clock path 160, and then output. Feedback clock signal CLK_P reproduced through the replica path unit 150 has substantially the same phase as the clock signal transferred to the final data output terminal of semiconductor memory device employing the DLL circuit.

The phase detecting unit 140 compares phases of external clock signal ECLK and the clock signal CLK_P fed back from the replica path unit 150, and outputs its result signal CON to the phase selection control unit 130.

The phase selection control unit 130 determines the amount of an increase/decrease in delay to be applied by the delay chain unit 110 according to a phase detection result signal CON input from the phase detecting unit 140, and controls a delay amount of the delay chain unit 11.0 according to the result. For example, the phase selection control unit 130 selects two clock signals CLK_D having a smallest phase difference from the external clock signal ECLK among clock signals passed through the delay cells D, by using control signal D1, D2.

Through such a configuration, the DLL circuit fixes a clock signal so that a phase of the clock signal used for an input/output terminal of final data of the semiconductor memory device synchronizes with the external clock signal ECLK. A delay amount of the delay chain unit 110 is controlled by using a measured phase difference between the external clock signal ECLK and the feedback clock signal, and the delayed clock signal is fixed; thus a phase of clock signal used for final data input/output synchronizes relative to the applied external clock signal ECLK.

The delay chain unit 110, the interpolation unit 120 and the phase selection control unit 130 are collectively and generally referred to herein as a small DLL unit SDLL, 180 for the purpose of explanation and convenience.

Figure 9:
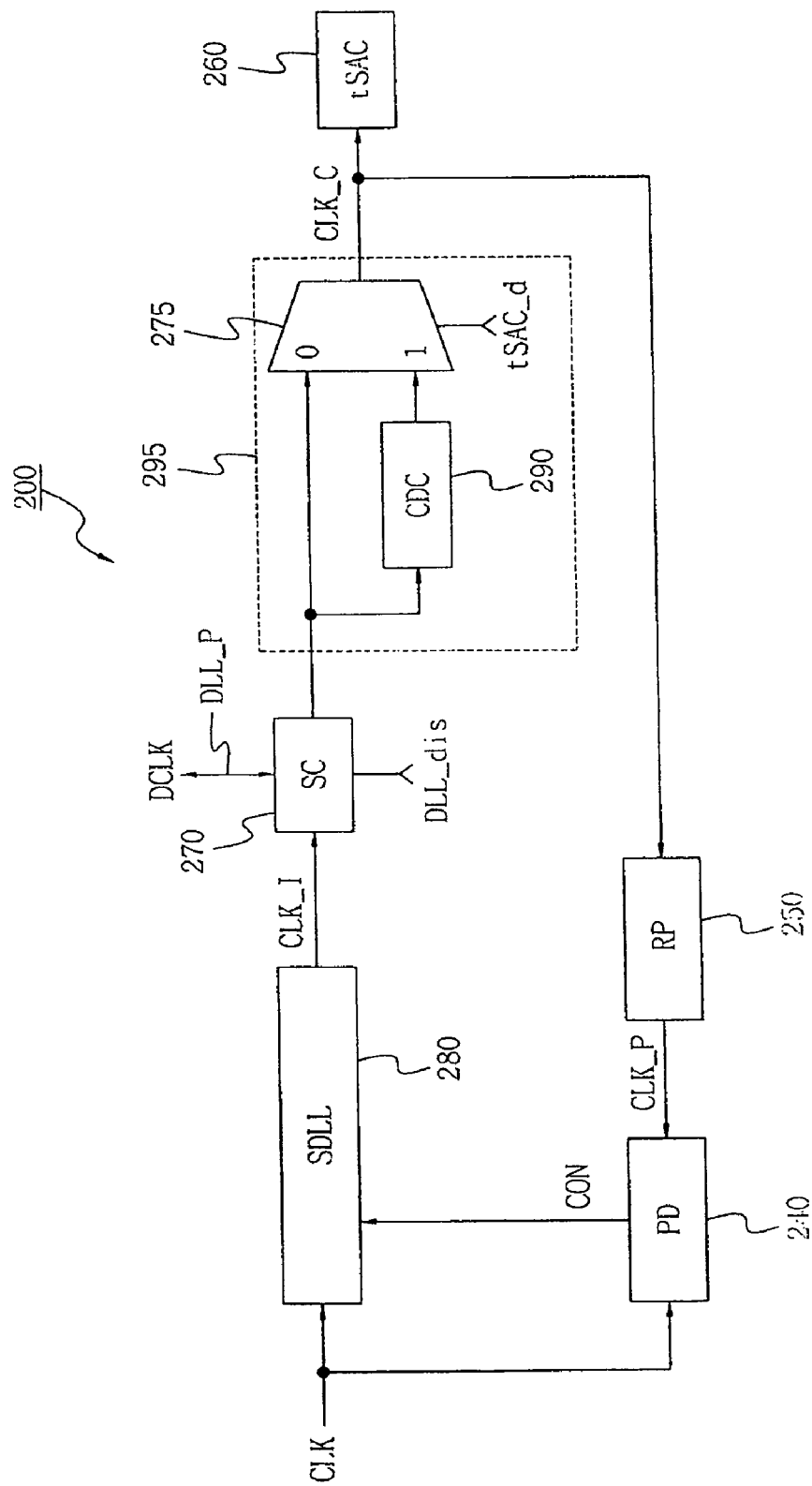
FIG. 9 is a block diagram of a DLL circuit according to another embodiment of the invention.

FIG. 9 is a block diagram of a DLL circuit 200 according to an embodiment of the invention.

As shown in FIG. 9, DLL circuit 200 according to an embodiment of the invention comprises a small DLL unit 280 SDLL, a switching unit 270, a delay selection unit 295, a replica path unit 250, and a phase detecting unit 240. Additionally, a DLL path DLL_P may be adapted to receive a DLL clock signal DCLK input from another DLL circuit (not shown) or transmit the DLL clock signal DCLK to the other DLL circuit.

The small DLL unit 280 may comprise a main delay chain unit that includes a plurality of main delay cells, delays the external clock signal ECLK input from an external source and outputs a first clock signal, and an interpolation unit for outputting a second clock signal CLK_I obtained through an interpolation of the first clock signal. The small DLL unit 280 may comprise a phase selection control unit as described above in connection with FIG. 8. The configuration or operation of the small DLL unit 280 is the same as the general case as illustrated in FIG. 8; thus a more detailed description is omitted.

The switching unit 270 performs a switching operation for enabling or disabling of the DLL circuit 200, and outputs the second clock signal CLK_I or the DLL clock signal DCLK.

For example, when an active DLL disable signal DLL_dis is input from an external source, the switching unit 270 outputs the DLL clock signal DCLK applied through the DLL path DLL_P to the delay selection unit 295. When the DLL disable signal DLL_dis is inactive, the switching unit 270 outputs the second clock signal CLK_I output from the small DLL unit 280, to the DLL path DLL_P and the delay selection unit 295.

In another example, when the DLL clock signal DCLK is input through the DLL path DLL_P, the switching unit 270 may cut off the second clock signal CLK_I and transmit the DLL clock signal DCLK to the delay selection unit 295. When the DLL clock signal DCLK is not input through the DLL path DLL_P, the switching unit 270 may operate to transmit the second clock signal CLK_I to the DLL path DLL_P and the delay selection unit 295. When the DLL clock signal DCLK is not input through the DLL path DLL_P, the second clock signal CLK_I may be transmitted as the DLL clock signal DCLK to the DLL path DLL_P.

The switching unit 270 can comprise, for example, a multiplexer, or may be configured with a simple switching device, and may be realized through a method or circuit well known to those skilled in the art.

The DLL clock signal DCLK indicates a clock signal transmitted through the DLL path DLL_P, and may indicate the second clock signal CLK_I output from the small DLL unit 280, and may be second clock signal CLK_I output from the other DLL circuit connected to the DLL path DLL_P. Even in case of the same second clock signal CLK_I, a clock signal transmitted through the DLL path DLL_P is referred to herein as a DLL clock signal DCLK, and a clock signal not passing through the DLL path DLL_P is referred to herein a second clock signal CLK_I, so that the two possibilities can be distinguished.

The delay selection unit 295 outputs the second clock signal CLK_I output from the switching unit 270, or a third clock signal CLK_C by selecting whether or not to compensate for a delay of the DLL clock signal DCLK.

When the second clock signal CLK_I is input from the small DLL unit 280, the delay selection unit 295 can compensate the second clock signal CLK_I for a delay corresponding to the DLL path DLL_P, and outputs it as the third clock signal CLK_C. When the DLL clock signal DCLK is input through the DLL path DL_P, the DLL clock signal DCLK is output as the third clock signal CLK_C without delay.

The delay selection unit 295 includes a compensation delay chain (CDC) 290 and a multiplexer 275. The compensation delay chain 290 includes a plurality of compensation delay cells capable of selecting a delay amount through a fuse option. The configuration of compensation delay chain 290 will be further described below with reference to FIG. 10.

The multiplexer 275 selects any one of a clock signal directly input, not passing through the compensation delay chain 290, and a clock signal compensated for a delay through the compensation delay chain 290, and outputs it. The multiplexer 275 operates in response to a control signal tSAC_d.

The multiplexer 275 operates in conjunction with the switching unit 270. For example, when the second clock signal CLK_I is output from the switching unit 270, a clock signal compensating for a delay through the compensation delay chain 290 is output as third clock signal CLK_C. When the DLL clock signal DCLK is output from the switching unit 270, the multiplexer 275 outputs the DLL clock signal DCLK as a clock signal as directly input, and not passing through the compensation delay chain 290, as the third clock signal CLK_C.

Operation of the multiplexer 275 is described with a control signal, as follows.

When the DLL disable signal DLL_dis is generated and the DLL clock signal DCLK is input, the multiplexer 275 may be controlled by control signal tSAC_d to select the DLL clock signal DCLK as the third clock signal CLK_C, the DLL clock signal DCLK being directly input, and not passing through the compensation delay chain 290. Meanwhile, when the DLL disable signal DLL_dis is not generated and so the second clock signal CLK_I is input, the multiplexer 275 may be controlled by control signal tSAC_d to select, as the third clock signal CLK_C, a clock signal compensated for delay through the compensation delay chain 290.

In another example, when the DLL path DLL_P is unnecessary and so not used, the switching unit 270 and the delay selection unit 295 may be controlled to operate as a general DLL circuit as in the circuit of FIG. 1. That is, the switching unit 270 may output the second clock signal CLK_I to the delay selection unit 295, and the delay selection unit 295 may output the second clock signal CLK_I as the third clock signal CLK_C without delay.

The replica path unit 250 is configured to have the same delay condition as an actual clock path tSAC 260 through which the third clock signal CLK_C output from the delay selection unit 295 is transferred to a final data output terminal of the semiconductor memory device. The third clock signal CLK_C output from the delay selection unit 295 is reproduced under the same delay condition as the actual clock path 260, and then output. The clock signal CLK_P reproduced and output from the replica path unit 250 has the same phase as clock signal transferred to the final data output terminal of the semiconductor memory device employing the DLL circuit.

The phase detecting unit 240 compares phases of external clock signal ECLK and feedback clock signal CLK_P from the replica path unit 250, and transmits a result signal CON to the small DLL unit 280. The small DLL unit 280 selects two clock signals CLK_D having a smallest phase difference relative to the external clock signal ECLK in response to the result signal CON, and outputs the second clock signal CLK_I. The operation repeats in iterative fashion.

Figure 10:
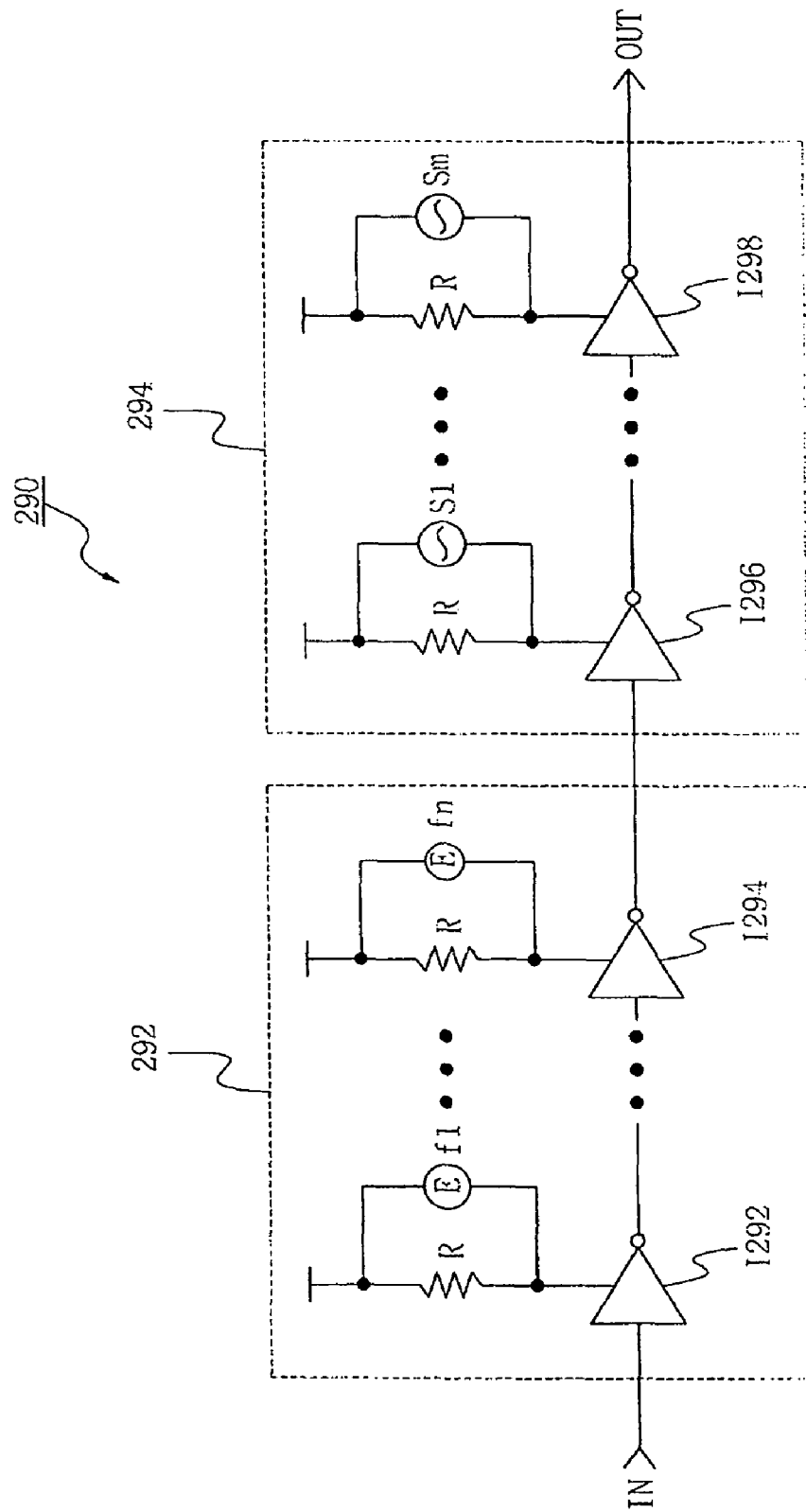
FIG. 10 illustrates an embodiment of the compensation delay chain shown in FIG. 9.

FIG. 10 illustrates an embodiment of the compensation delay chain shown in FIG. 9.

The compensation delay chain 290 includes inverters I292, I294, I296 and I298, a plurality of resistances R, and various fuses f1~fn, S1~Sm, with a wiring structure shown in FIG. 10.

As shown in FIG. 10, the compensation delay chain 290 may comprise a delay chain 292 that is available to perform a tuning of delay amount through a fusing of electrical fuses E-fuse, f1~fn, and a delay chain 294 that is available to perform a tuning of delay amount through a fuse option valid for a fusing by using laser or other MRS. The compensation delay chain 290 is configured to compensate for a delay amount produced in the DLL path DLL_P, and has a structure to perform a tuning through a fuse option as described above so as to meet a PVT (Process, Voltage, Temperature) change and other variables. That is, the delay amount can be controlled by a cutting of the fuses f1~fn, S1~Sm.

Figure 11:
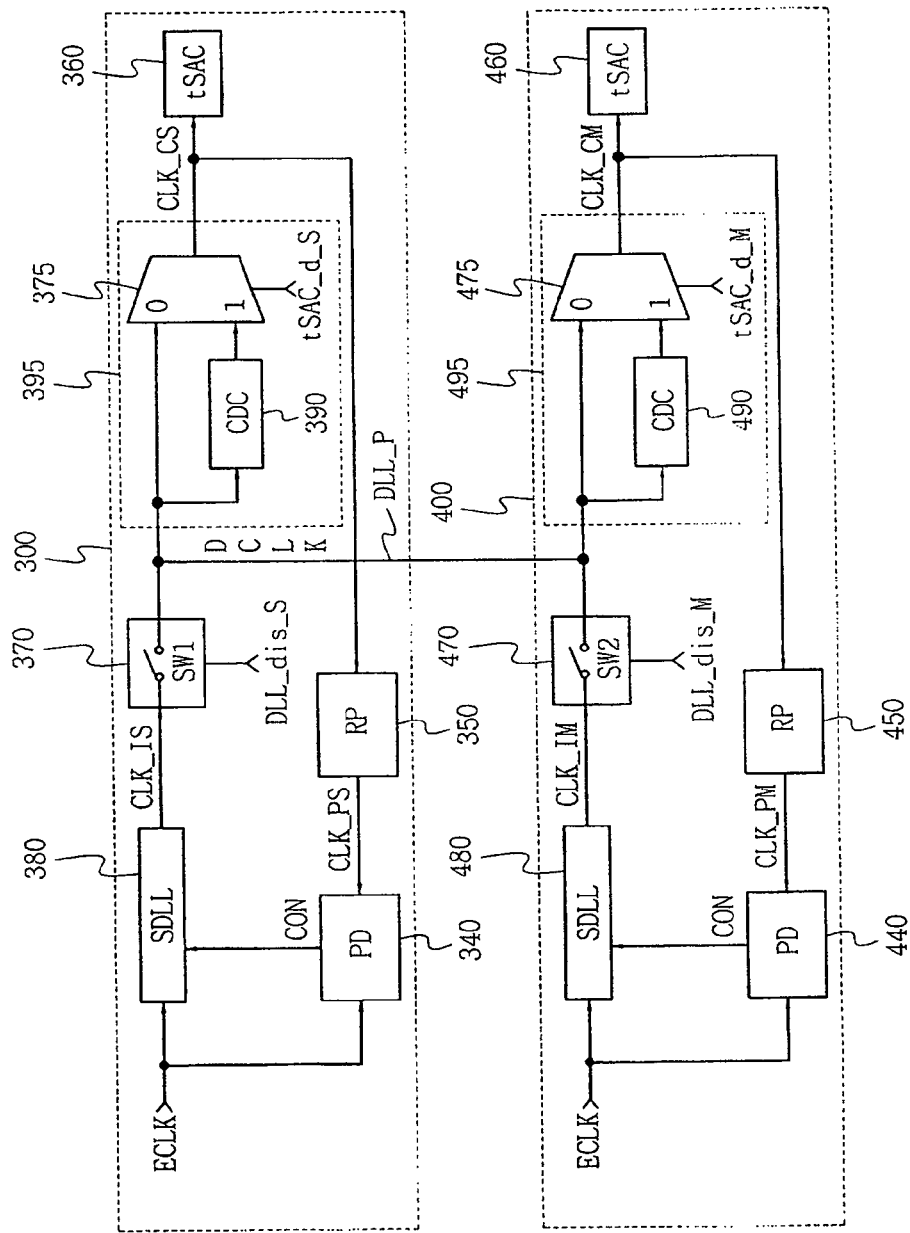
FIG. 11 illustrates an application example of the DLL circuit shown in FIG. 9, in a dual die package structure.

FIG. 11 illustrates an applied example of DLL circuit shown in FIG. 9, configured as a dual-die package structure. The embodiment of FIG. 11 is merely an example, and in other examples, the DLL circuit of FIG. 9 can be applied, of course, to a stacked structure of three or more semiconductor chips based on the same structure and to a stacked structure of different kinds of plural chips, and this is applicable through a delay compensation in the compensation delay chain 290.

As shown in FIG. 11, there is shown a structure of DLL circuits inside two semiconductor chips 300 and 400 having a stacked configuration. A lower semiconductor chip is referred to as a master chip 400 and an upper semiconductor chip is referred to as a slave chip 300. At least one slave chip 300 may be adapted herein. The master chip 400 and the slave chip 300 may include a memory cell array, a core circuit and peripheral circuits necessary for operation, additionally to the DLL circuit. Only the DLL circuit is described herein, relating to embodiments of the invention.

DLL circuits adapted in the master chip 400 are referred to herein as master DLL circuits, with reference numbers relating to a number '400' indicating the master chip, and DLL circuits adapted in the slave chip 300 are called a slave DLL circuit, with reference numbers relating to '300' indicating the slave chip.

The master DLL circuit 400 and the slave DLL circuit 300 each has the configuration and operation as described above with reference to FIG. 2, only with a difference that the switching unit 370, 470 has a structure of a simple switch SW1, SW2, and the DLL path DLL_P has a structure of being connected directly between the master DLL circuit 400 and the slave DLL circuit 300 without switching.

In this configuration, a DLL clock of the master chip 400 is shared by at least one slave chip 300. At this time, in the slave DLL circuit, a DLL disable signal DLL_dis_S is generated and a switch SW1 of the switching unit 370 is opened. Also, a control signal tSAC_d_S to control a multiplexer 375 is generated so as to output DLL clock signal DCLK input through the DLL path DLL_P without a delay. Then, a switch SW2 of the switching unit 470 of the master DLL circuit 400 is closed, and a multiplexer 475 of a delay selection unit 495 generates a control signal tSAC_d_M to select a clock signal output through compensation delay chain 490.

Figure 12:
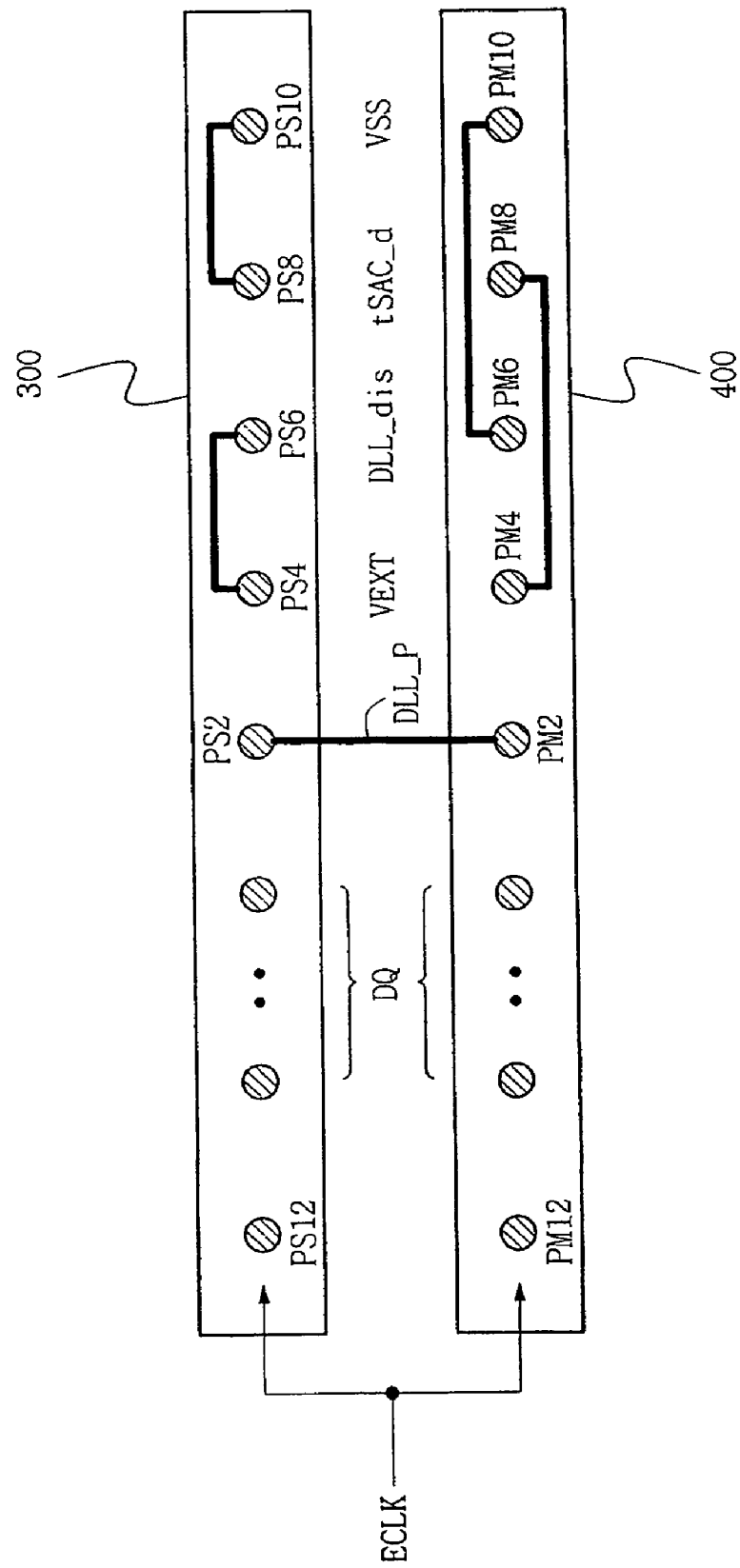
FIG. 12 illustrates a connection structure for pads of semiconductor chips in the dual die package structure referred to in FIG. 11.

FIG. 12 illustrates a connection structure of pads of the master chip 400 and the slave chip 300.

As shown in FIG. 12, the master chip 400 and the slave chip 300 have the same structure and each includes a plurality of pads. A pad PS12 is included to input external clock ECLK, DQ pads DQ are included for an input/output of data, a pad PS2 is included for DLL path DLL_P, a pad PS4 is included to apply power source voltage VEXT, a pad PS6 is included to apply a DLL disable signal DLL_DIS, a pad PS8 is included to apply a multiplexer control signal tSAC_d, and a ground (VSS) pad PS10 is included.

For a shared DLL clock of the master chip 400, the pads may have the following connection structure. Pads PS2 and PM2 for the DLL path DLL_P of the master chip 400 and the slave chip 300 are electrically connected to each other, thus forming the DLL path DLL_P. The connection of pads for the DLL path DLL_P may be obtained by using the 'through VIA connection' technique. The 'through VIA connection' technique is a connection method of pads or ports that a port or pad of one chip has a convex protrusion, and a port or pad of another chip is adapted with a recess at a corresponding position, thus two chips can be connected to each other in a stacked configuration without a specific wiring connection. Additionally to the 'through VIA connection' technique, a wire bonding or other connection method well known to those skilled in the art may be used.

The pad PS6 to apply DLL disable signal DLL_dis of the slave chip 300 is coupled to the pad PS4 to apply power source voltage VEXT. Then, DLL disable signal DLL_dis of the slave DLL circuit is generated, and thus switching unit 370 of the slave DLL circuit remains open. The pad PS8 to apply multiplexer control signal tSAC_d is coupled to the ground pad PS10, thus the multiplexer 375 selects a clock signal without a delay. The connection of pads in the same chip may be obtained by a bonding.

The pad PM6 to apply DLL disable signal DLL_dis of the master chip 400 is connected to the ground pad PM10. Then, DLL disable signal DLL_dis of the master DLL circuit is not generated, and thus, the switching unit 470 of the master DLL circuit remains closed. A pad PM8 to apply multiplexer control signal tSAC_d of the master chip 400 is coupled to a pad PM4 to apply power source voltage VEXT, thus the multiplexer 475 selects a clock signal passed through the compensation delay chain 490.

Referring back to FIG. 11, operation of the master DLL circuit 400 and the slave DLL circuit 300 is described as follows.

First, external clock signal ECLK is applied, and so a second clock signal CLK_IM is generated from small DLL unit 480 of the master DLL circuit 400. The generation procedure of the second clock signal CLK_IM is the same as the description for FIGS. 2 and 3. The second clock signal CLK_IM is transmitted through the switching unit 470 and transmitted as DLL clock signal DCLK to the DLL path DLL_P, and transmitted as the second clock signal CLK_IM to the delay selection unit 495.

In the delay selection unit 495, the second clock signal CLK_IM is passed through the compensation delay chain 495, and third clock signal CLK_CM compensated for a delay is output. The third clock signal CLK_CM is supplied to circuits of the master chip 400.

DLL clock signal DCLK transmitted through the DLL path DLL_P is applied to delay selection unit 395 of the slave DLL circuit 300. In the delay selection unit 395, the signal is immediately selected without passing through compensation delay chain 390 and output as third clock signal CLK_CS. The third clock signal CLK_CM output from the master DLL circuit 400, and the third clock signal CLK_CS output from the slave DLL circuit 300, have the same phase. The third clock signal CLK_CS of the slave DLL circuit 300 is supplied to circuits of the slave chip 300.

Remaining components 380, 340 and 350 other than the switching unit 370 and the delay selection unit 395 in the slave DLL circuit 300 may actually operate or may not operate, but such operation has no significance herein, thus a description of their operation is omitted. Operation of the replica path unit 450 and the phase detecting unit 440 in the master DLL circuit 400 is the same as the description of FIG. 3.

The replica path unit 450 is configured to have the same delay condition as an actual clock path tSAC 460 through which the third clock signal CLK_CM output from the delay selection unit 495 is transferred to a final data output terminal of semiconductor memory device. The third clock signal CLK_CM output from the delay selection unit 495 is reproduced under the same delay condition as the actual clock path 460, then output. The feedback clock signal CLK_PM reproduced through the replica path unit 450 has the same phase as clock signal transferred to final data output terminal of the semiconductor memory device employing the DLL circuit.

The phase detecting unit 440 compares phases of external clock signal ECLK and feedback clock signal CLK_P from the replica path unit 450, and transmits its result signal CON to the small DLL unit 480. The small DLL unit 480 selects two clock signals having a smallest phase difference from the external clock signal ECLK in response to the result signal CON, and outputs the second clock signal CLK_IM.

The DLL circuit and semiconductor chip package structure as described above has an advantage of sharing one DLL clock signal by several semiconductor chips. Additionally, power consumption can be lessened with only operation of one DLL circuit.

As described above, according to some embodiments of the invention it is possible to produce DC chips at a relatively chip cost by employing an operation-specific DC chip. Further, the circuits operate independently, and are comparatively free from a limit of area, thus more accurate control of a target level by employing more fuses or pumping capacitance is possible.

In addition, a DLL path is configured to share a DLL clock, and so one DLL clock signal can be shared by several semiconductor chips. Power consumption can be reduced, through operation of a single DLL circuit. Furthermore, in some embodiments, only one chip includes a DLL circuit, thereby reducing chip size of remaining chips.

It will be apparent to those skilled in the art that modifications and variations can be made in the present invention without deviating from the spirit or scope of the invention. Thus, it is intended that the present invention cover any such modifications and variations of this invention. Accordingly, these and other changes and modifications are seen to be within the true spirit and scope of the invention as defined by the appended claims. In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A semiconductor chip package comprising at least two semiconductor chips having a stacked configuration, the semiconductor chips including at least one DLL path for a sharing of a DLL clock signal generated by any one of the semiconductor chip, wherein each of the semiconductor chips includes a DLL circuit and a switching circuit for enabling or disabling of the DLL circuit, only one DLL circuit provided on any one of the semiconductor chips is in an enable state, and a remainder of DLL circuits on other semiconductor chips are in a disable state, and wherein the DLL circuit provided in each of the semiconductor chips comprises:

a main delay chain unit including a plurality of main delay cells, for delaying an external clock signal, and outputting a first clock signal;

an interpolation unit for outputting a second clock signal obtained by interpolating the first clock signal;

a switching unit for performing a switching of the DLL path and a switching for an enable or disable of the DLL circuit, and outputting the second clock signal or the DLL clock signal in response;

a delay selection unit for selecting a delay compensation of the second clock signal or the DLL clock signal output from the switching unit, and generating a third clock signal;

a replica path unit configured to have a same delay condition as an actual clock path, the replica path unit receiving the third clock signal, delaying it by a given time according to a delay condition, and outputting a fourth clock signal; and a phase detecting unit for comparing phases of the fourth clock signal and the external clock signal, outputting a detection signal corresponding to the comparison result, and controlling a delay amount of the first clock signal output from the main delay chain unit.

2. The package of claim 1, wherein when the DLL clock signal is input through the DLL path, the switching unit cuts off the second clock signal and transmits the DLL clock signal to the delay selection unit, and when the DLL clock signal is not input through the DLL path, the switching unit transmits the second clock signal to the DLL path and the delay selection unit.

3. The package of claim 2, wherein the delay selection unit outputs the DLL clock signal as the third clock signal without a delay when the DLL clock signal is input, and compensates the second clock signal for a delay amount corresponding to the DLL path when the second clock signal is input, and outputs it as a third clock signal.

4. The package of claim 3, wherein the delay selection unit comprises:

a compensation delay chain including a plurality of compensation delay cells selectable for a delay amount through a fuse option; and a multiplexer for selecting and outputting any one clock signal among a clock signal directly input without passing through the compensation delay chain and a clock signal compensated for a delay through the compensation delay chain.

5. The package of claim 4, wherein the semiconductor chip package has a stack structure of one master chip and at least one slave chip, and wherein the master chip provides the DLL clock signal to the at least one slave chip through the DLL path in the DLL circuit.

6. The package of claim 5, wherein the switching unit of the DLL circuit adapted in the master chip transmits the DLL clock signal as the second clock signal to the at least one slave chip through the DLL path, and transmits the second clock signal to the delay selection unit, and the delay selection unit of the DLL circuit adapted in the master chip compensates for a delay of the second clock signal, and outputs it as a third clock signal.

* * * * *